United States Patent [19]

Hungerford

[11] 4,134,106
[45] Jan. 9, 1979

[54] ABSOLUTE RESOLVER ANGLE TO DIGITAL CONVERTER CIRCUIT

[75] Inventor: William R. Hungerford, Detroit, Mich.

[73] Assignee: The Bendix Corporation, Southfield, Mich.

[21] Appl. No.: 751,414

[22] Filed: Dec. 16, 1976

[51] Int. Cl.² .......................................... H03K 13/02
[52] U.S. Cl. ............................ 340/347 SY; 318/569; 318/661; 340/198; 340/347 M; 235/92 MP
[58] Field of Search .... 340/347 M, 347 SY, 347 AD, 340/198; 318/661, 569; 235/92 MP

[56] References Cited

U.S. PATENT DOCUMENTS

| | | | |
|---|---|---|---|
| 3,078,400 | 2/1963 | Kilroy et al. | 340/347 SY X |
| 3,634,838 | 1/1972 | Grandqvist | 340/347 SY X |
| 3,676,650 | 7/1972 | Heneger | 340/347 SY X |
| 3,878,535 | 4/1975 | Twiss | 340/347 SY |
| 4,010,463 | 3/1977 | Kay | 340/347 SY |

*Primary Examiner*—Thomas J. Sloyan
*Attorney, Agent, or Firm*—James R. Ignatowski; Russel C. Wells

[57] ABSTRACT

An absolute resolver digitizer for a numerical control system generating a digital number indicative of the absolute angular position of a resolver's rotor within a given revolution is disclosed herein. The resolver digitizer comprises a reference generator generating resolver excitation signals and a digital number indicative of the phase of the generated excitation signals and a resolver follower generating a digital number indicative of the sum of phase of the excitation signal generated by the reference generator and the angular position of the resolver's rotor. Subtraction of the digital number generated by the reference generator from the digital number generated by the resolver follower produces a digital number indicative of the resolver's absolute position within a given revolution. This subtraction may be performed by a separate circuit within the absolute resolver digitizer or may be performed by the computer associated with the numerical control system.

22 Claims, 1 Drawing Figures

ABSOLUTE RESOLVER ANGLE TO DIGITAL CONVERTER CIRCUIT

BACKGROUND OF THE INVENTION

1. Field of the Invention

The invention relates to numerical control systems having servotype position control means and in particular to a resolver digitizer generating a digital signal indicative of the absolute position of the member being controlled within each revolution of the resolver.

2. Description of the Prior Art

Numerical Control Systems for use in connection with the operation of various instrumentalities such as milling and drafting machines, as well as process controllers have been known to industry for many years. In a typical numerical system, position commands are generated in response to data derived from a record, such as a punched tape, and are applied as one of two inputs to a servo control loop. The servo loop serves to produce an error signal indicative of the instantaneous difference between a commanded position and the actual position of the member being controlled. The error signal is then applied to a motive means of the position control system tending to drive the error signal to zero.

The typical prior art servo mechanism error signal generator comprises a plurality of resolvers or inductrosyns one for each axis of controlled displacement, operative to produce a series of phase shifted signals, wherein the degree of the phase shift is a function of the departure of the actual position from the commanded position at a given time. The error signals are then applied to a zero crossing detector to produce a square wave having a variable phase relative to a reference signal. This phase shiftable square wave is applied to a phase shift detector which produces an output waveform representing the position error signal. The output waveform is a pulse width modulated signal, the d.c. value of which represents the position error. This d.c. signal is then applied to the input drive mechanism which changes the position of the member being controlled accordingly.

The form of the d.c. signal, as is apparent to those skilled in the art, is a voltage which varies linearly from a negative value representing a position lag to positive value representing a position lead over a range of displacement increments representing actual position error. In this type of system, the complete servo loop is external to the computer, and the computer never receives data indicative of the actual position of the member being controlled.

With the event of low cost general purpose computers having excess storage and computation capacities, the more recent art has moved in a direction towards reducing the peripheral or external hardware of the servo loop and incorporating their functions in the general purpose computer. In newer systems data indicative of the actual position of the member being moved is maintained in the computer. The error signal is then computed in the general purpose computer by comparing the actual position with the commanded position. These systems embody a resolver follower which generates digital data indicative of incremental changes in the position of the resolver. This digital data is summed in an actual position register to give the actual position.

Past experience with these types of systems has shown that this method is not totally satisfactory because errors are cumulative, and start up requires that the system be precisely set at a predetermined starting location for the actual position register to accurately contain the actual position.

The disclosed system eliminates both of these problems by providing to the computer digital data indicative of the absolute position of the resolver within each revolution of the resolver eliminating the accumulation of errors in the computer's actual position register and the need for returning the system precisely to a predetermined start location.

SUMMARY OF THE INVENTION

The invention is an absolute resolver digitizer generating digital data indicative of the location of the driven member of a numerical control system within any given rotation of the resolver. The system comprises a reference signal generator generating sine and cosine signals exciting a resolver to generate a rotating magnetic field which cyclically rotates through 360 degrees in a predetermined period of time and digital data indicative of the phase angle of the rotating magnetic field, a resolver receiving said sine and cosine signal generating a signal having a phase indicative of the instantaneous sum of the actual position of the resolver's rotor and the phase angle of the rotating magnetic field, and a resolver follower generating a digital signal indicative of the phase of the signal generated by the resolver wherein the computer combines the digital data generated by the reference signal generator with the digital data generated by the resolver follower to generate digital data indicative of the actual position of the rotor within a given 360 rotation of the resolver's rotor. The computer may then sum the digital data indicative of the rotor's actual position with a stored number of revolutions to generate a digital number indicative of the actual position of the member being moved. The computer then compares the difference between the actual position data with the commanded position data and generates an error signal which is applied to the motive means controlling the position of the driven member.

The actual position register in the computer is updated with a new digital number indicative of the driven member's position, each time the computer requests new data. Position errors of prior data are eliminated since the old position data is discarded each time new position data is received. Secondly, since the input is a number indicative of the rotor's position, no precise starting point is required other than the correct number of revolutions of the resolver's rotor.

An object of the invention is an absolute resolver digitizer, generating a digital number indicative of the instantaneous position of the resolver's rotor.

Another object of the invention is an absolute resolver digitizer wherein any errors introduced in prior inputs to the computer are not cumulative.

Still another object of the invention is an absolute resolver digitizer which does not require a precise start up setting.

These and other advantages of the disclosed absolute resolver digitizer will become apparent from reading the following detailed description of the invention in conjunction with the drawings.

DETAILED DESCRIPTION OF THE PREFERRED EMBODIMENT

Figure 1:
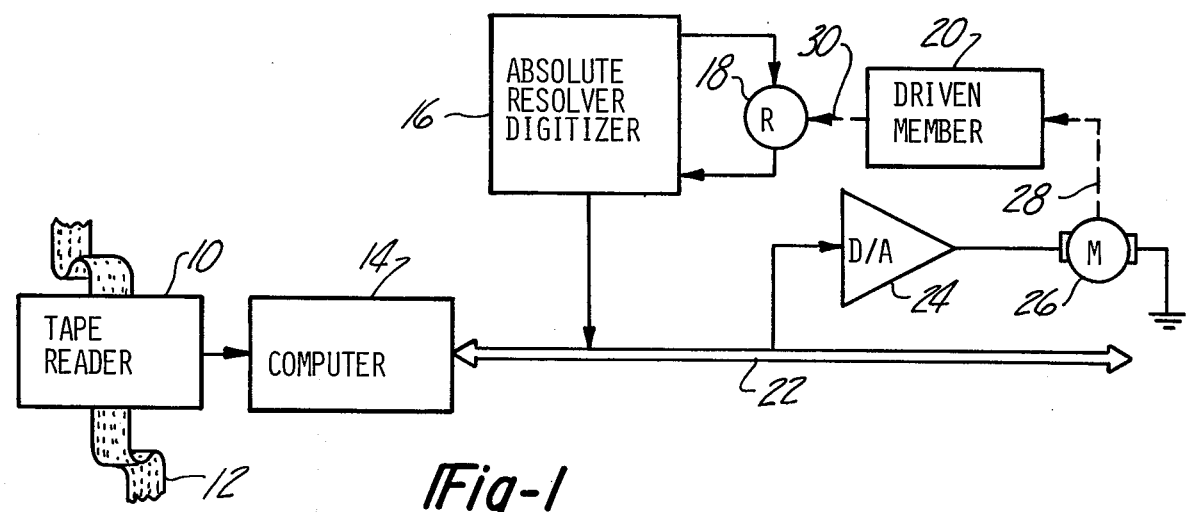
FIG. 1 is a block diagram of the absolute resolver digitizer as applied to a numerically controlled machine having a general purpose computer.

Referring to FIG. 1, the pertinent elements of a numerically controlled machine such as a lathe, milling machine, drafting machine or the like are shown. Although the invention will be described in detail with reference to controlling the position of a driven member along only one axis, it would be obvious that a like absolute digital resolver may be applied to each axis of a multiple axis machine. Numerical data in the form of a prepared program is read from a permanent record illustrated as punched tape 10 by a tape reader 12 adapted to convert the recorded information into electrical signals. It is recognized that the permanent record and reader may take other forms than the illustrated punched tape and tape reader. These other forms are well known to those skilled in the art, and need not be enumerated here. A computer 14 receives the data from the reader 12 and computes commanded positions at routine intervals. In a typical numerically controlled system, the information received by the computer 14 from the reader 12 may be a position, direction and feed rate from which the computer, by means of interpolation computes the commanded positions. The computed commanded position is temporarily stored in the computer.

The computer also receives actual position data from the Absolute Resolver Digitizer 16 responding to a resolver 18 generating a signal indicative of the actual position of a driven member 20. In a numerically controlled machine the moveable member 20 may be the tool or the carriage from which the part to be machined is supported. The computer then compares the actual position with the commanded position and generates an error signal which is transmitted to a motive means illustrated as a digital to analog converter 24 and a motor 26 via the bi-directional bus 22. The motive means responds to the error signal and moves the driven member by means of a mechanical linkage, illustrated by dashed line 28, in a direction tending to reduce the error signal to zero. The resolver 18 may be driven by a mechanical linkage, dashed line 30, connecting the resolver 18 to the driven member 20 or may be driven directly by the motor 26, as is well known in the art. In this manner, the servo loop is closed through the computer and the computer always has digital data stored therein indicative of the driven member's actual position. The computer may then correct the actual position data for known errors such as mechanical errors in a lead screw, display the actual position of the driven member, or perform other data manipulations as may be necessary or desired.

Figure 2:
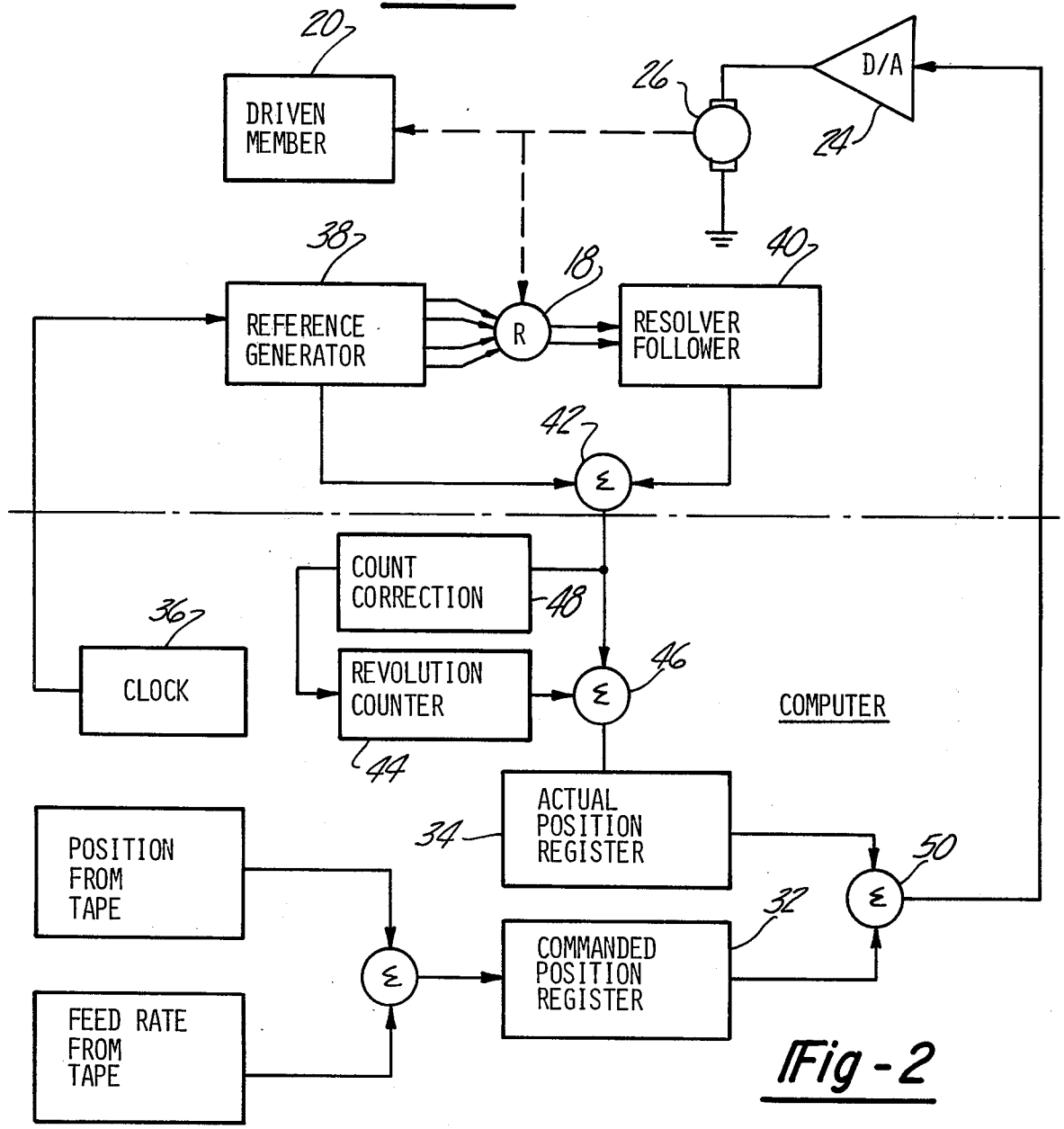
FIG. 2 is a functional block diagram illustrating the interrelationship between the absolute resolver digitizer and the computer.

Referring now to FIG. 2, the details of a servo loop embodying the Absolute Resolver Digitizer and a general purpose computer are shown. The functional elements of the computer 14 are shown below the phantom (dash-dot) line while the elements of Absolute Resolver Digitizer 16 and external elements of the numerical control system are shown above the phantom line. As previously indicated, the command position data is computed from the position data and commanded feed rate read from the tape and stored in a commanded position register 32 using any of the various methods known in the art. The data stored in the commanded position is routinely updated as a function of the commanded feed rate and represents the instantaneous commanded position.

The actual position data is stored in actual position register 34. The actual position data is generated by the combined action of the Absolute Resolver Digitizer and the computer as follows: Signals from a clock 36 are input to a Reference Generator 38. The clock may be the internal clock of the computer as shown, or may be a separate clock providing the clock signals for both the computer and the Reference Generator. The Reference Generator 38, in response to the clock signals, generates resolver excitation signals which are applied to the input terminals of resolver 18. The resolver 18 in response to the resolver excitation signals generates a rotating magnetic field which rotates through 360 degrees within a predetermined number of input clock pulses. The Reference Generator 38 also stores the number of clock pulses received during each revolution of the magnetic field thereby containing a stored number (data) indicative of the instantaneous angular orientation or phase of the rotating magnetic field, which may be read out by the computer at any time.

The rotating magnetic field induces a signal in the rotor of the resolver which is indicative of the instantaneous phase or angular difference between the orientation of the rotor and the rotating magnetic field. This signal is applied to a Resolver Follower 40, which generates digital data indicative of the phase difference between the position of the rotor and the rotating magnetic field which also may be read out by the computer at any time.

Upon a command signal generated by the computer the data stored in the Reference Generator 38 and the data stored in the Resolver Follower 40 are combined in a sum circuit 42 to generate a digital number indicative of the instantaneous position of the rotor with reference to the initial or start position (zero phase) of the revolving magnetic field. The sum circuit 42 may be embodied in the Absolute Resolver Digitizer 16, as shown, or alternatively this combining function of sum circuit 42 may be performed by the Computer 14. In the preferred embodiment discussed hereafter, it is assumed the computer has excess computation capacity, therefore, the sum circuit 42 is omitted from Resolver Digitizer 16, and the equivalent function is performed by the Computer 14. Both embodiments are within the purview of the invention.

The actual position of the driven member, however, is determined by both a digital number indicative of the number of revolutions of the resolver's rotor from a starting point (coarse position) and the digital number indicative of the position of the rotor within that revolution (fine position). The digital number indicative of the coarse position, i.e. the number of revolutions is stored in a revolution counter 44 and is summed 46 with the digital number indicative of the fine position, i.e. the rotor's position, prior to being stored in the actual position register 34. The coarse position number is obtained by comparing the rotor position data between two successive readouts and when necessary, increments or decrements the number stored in the revolution counter 44. When the data change is indicative of a change from a large phase angle to a small phase angle, the revolution counter 44 is incremented one count, however, if the change in the data is reversed, indicating the rotor is moving in the opposite direction, the revolution counter is decremented one count.

The error signal is generated by summing 50 the data content of the actual position register 34 with that of the commanded position register 32 to determine the difference. The error signal is then transmitted to the digital to analog converter 24 which generates a signal operative to activate the motor 26 to move the driven member 20 and the resolver 18 in a direction reducing the error signal to zero.

The functions performed by the general purpose computer 14 discussed above are well known and a person skilled in the art would have no difficulty in programming the computer to perform them.

Figure 3:
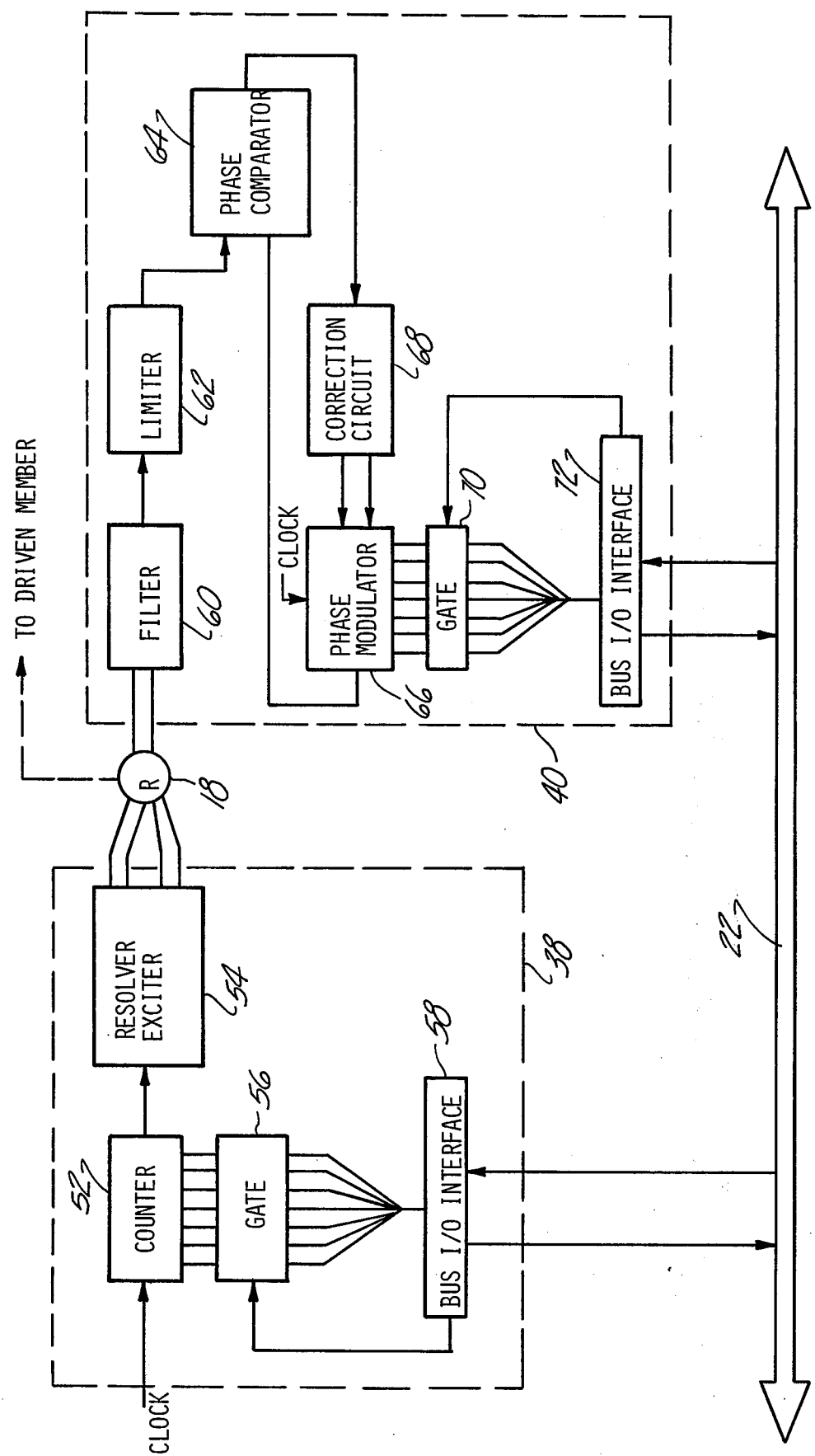
FIG. 3 is a block diagram showing the details of the absolute resolver digitizer in greater detail.

The details of the Reference Generator 38 and the Resolver Follower 40 are illustrated in FIG. 3. The Reference Generator 38 includes a Counter 52 receiving clock signals from an external clock as described with reference to FIG. 2. The Counter 52 provides two functions. It's first function is to divide the clock signals by a predetermined number. The overflow signals of the counter 52 applied to the Resolver Exciter 54 control the generation of the signals which excite the resolver 18 to generate the rotating magnetic field which rotates one complete revolution between successive overflow signals. The Counter 52 also stores the number of clock pulses between overflow signals wherein the number of stored clock pulses is indicative of the instantaneous phase angle of the rotating magnetic field. A Gate 56 transmits the number of stored clock pulses to the bi-directional Data Bus 22 through a Bus I/O Interface 58 upon a command signal generated by the computer. The command signal is transmitted to the Gate 56 via the bi-directional Data Bus 22 and Bus I/O Interface 58. In the preferred embodiment, the counter divides the clock signals by 2000 so that each stored clock signal is indicative of 1/2000 of a revolution, however, the counter may divide the clock signals by any other number to provide the system with the desired position accuracy.

The Resolver Exciter 54 is of conventional design and generates two signals applied to the stator windings of resolver 18 simulating the sine and cosine functions necessary to generate the revolving magnet field.

In the preferred embodiment the sine and cosine functions are simulated by square waves as is the common practice in the art. Circuits for generating simulated sine and cosine functions are well known and need not be discussed in detail.

The signal induced in the resolver rotor winding is a complex wave consisting of the fundamental frequency and odd harmonics which are applied to a Filter 60 in the Resolver Follower 40. The Filter 60 removes the harmonics and outputs a sine wave which is squared by a Limiter 62. The output of the Limiter 62 is a square wave signal and the phase of this square wave signal is a direct measure of the instantaneous angular difference between the position of the resolver's rotor and the rotating magnetic field.

The square wave signal from the Limiter 62 is input to a Phase Comparator 64 where it is compared with a like signal generated by a Phase Modulator 66. The Phase Comparator 64 generates a phase error signal indicative of magnitude of the phase difference between phase signal received from Limiter 62 and the phase signal generated by Phase Modulator 66 and a sign signal indicative of the direction of the phase error. The function of the phase Correction Circuit 68 is to generate signals controlling the Phase Modulator 66 so that the phase difference between the signal generated by the Phase Modulator 66 and that received from the Limiter 62 tends to zero.

The Phase Modulator 66 embodies a counter similar to Counter 52 in the Reference Generator 38. The phase signal generated by the Phase Modulator is a square wave generated by the counter when it overflows. When the phase error is zero, the instantaneous number of counts stored in the phase modulator's counter is offset from the number of counts stored in Counter 52 by a number indicative of the phase of the resolver's rotor.

When the resolver's rotor is stationary, both counters are incremented at the same rate by clock signals and the off-set difference remains constant. However, when the resolver's rotor is moving at a constant rate, the signal generated by the Correction Circuit 68 increments or decrements the clock signals received by the counter in the Phase Modulator 66 to synchronously change the offset with the changing rotor's position, as shall be explained with reference to circuit diagram of the correction circuit illustrated on FIGS. 6 and 7 and the waveforms on FIGS. 8 through 10.

A Gate 70 transmits the number of stored clock pulses in the pulse modulators counter to the bi-directional Data Bus 22 through a Bus I/O Interface 72 upon a command signal generated by the computer 14. The details of the Phase Comparator 64, Correction Circuit 68 and Phase Modulator 66 are discussed below.

PHASE COMPARATOR

Figure 4:
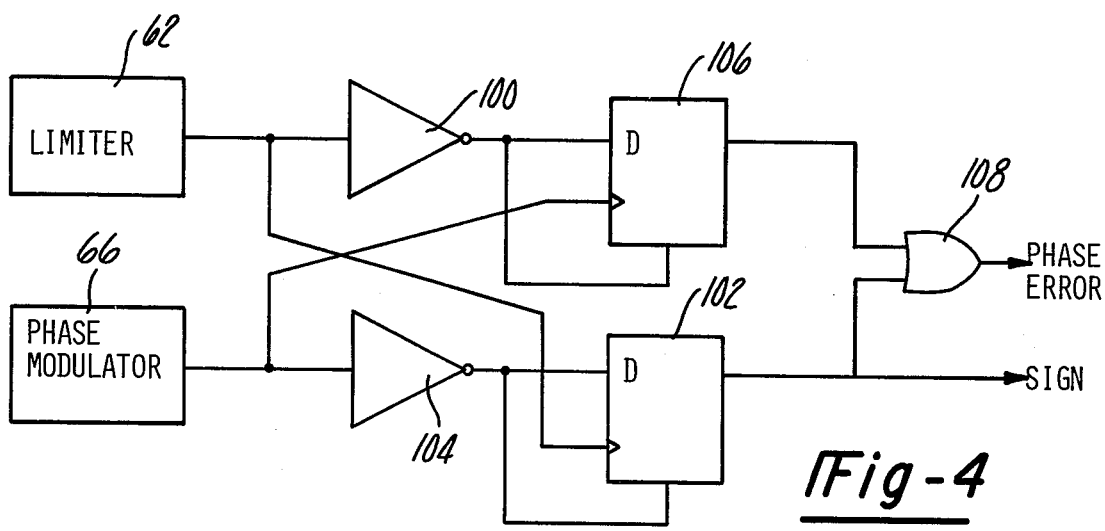
FIG. 4 is a circuit diagram of the phase comparator.

The Phase Comparator 64 produces an output pulse signal each time there is a phase difference between the square wave signal from the Limiter 62 in response to the signal generated by the Resolver 18 and the square wave signal generated by the Phase Modulator 66. The time duration or width of the generated pulse signal is a measure of the phase difference between the two square wave signals. A circuit diagram of the Phase Comparator 64 is illustrated in FIG. 4.

The Phase Comparator receives the square wave signals generated by the Limiter 62 and the Phase Modulator 66. The output of the Limiter 62 is applied to the input of an inverter amplifier 100 and the clock input of a D type flip flop 102 while the output of the Phase Modulator is applied to the input of an inverter amplifier 104 and the clock input of a D type flip flop 106. The inverted output of amplifier 100 is applied to the D and clear inputs of flip flop 102 while in a like manner the inverted output of amplifier 104 is applied to the D and clear inputs of flip flop 106. The outputs of flip flops 102 and 106 are applied to alternate inputs of OR gate 108.

Figure 5:
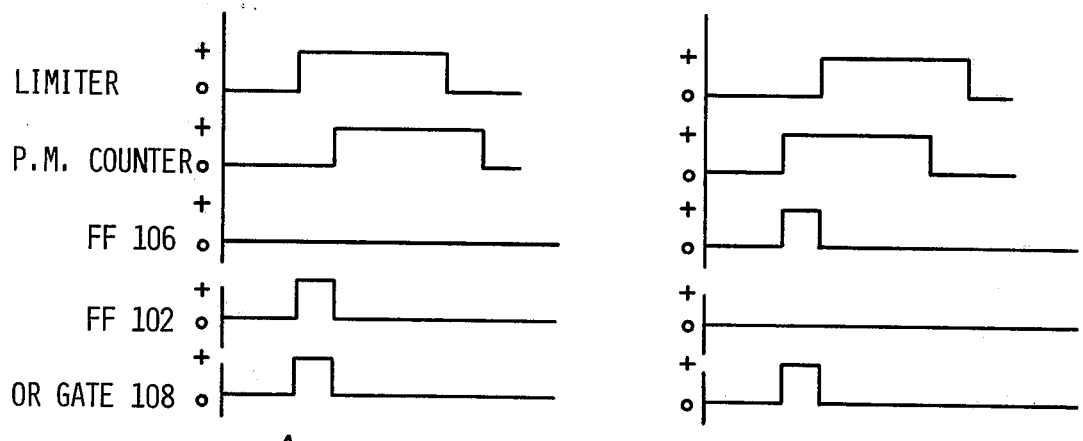
FIG. 5 illustrates the waveforms at various points in the phase comparator.

The operation of the circuit is as follows. When both square wave signals are present and in phase both flip flops are held in a reset state (outputs switched to a low or a logic 0) by the inverted square wave signals applied to the clear inputs of the flip flops 102 and 106. However, when the input signals are not in phase, and the square wave signal from the Limiter 62 precedes the square wave signal from the Phase Modulator 66, the rising edge of the Limiters phase signal clocks flip flop 102 and it changes to the SET state in response to the high or logic 1 output of the inverter amplifier 104 at its D input. This applies a high to the input of OR gate 108 and initiates the generation of the error signal at its output. The high output of flip flop 102 is also used as a sign signal indicative that the square wave signal from the Limiter 62 preceded the signal from the Phase Modulator. During this period flip flop 106 is disabled by the low output of the Phase Modulator as illustrated on FIG. 5A. When the signal from the Phase Modulator arrives, the output of the inverter amplifier 104 goes low and flip flop 102 is reset terminating the signal to OR gate 108 and terminates the error signal. Since flip flops 102 and 106 can only be enabled by the leading edge of the phase signals, both flip flops will remain the reset state until the arrival of the next phase signals. FIG. 5B shows the states of flip flops 102 and 106 and the output of OR gate 108 when the signal from the Phase Modulator 66 precedes the signal from the Limiter 62.

CORRECTION CIRCUIT

The function of the Correction Circuit 68 is to keep the output of the phase modulator's counter in phase with the output of the Limiter 62 when the resolver's rotor is stationary or moving at a constant velocity. The correction circuit provides two independent parallel circuits for both the error signal and the sign signal which are summed to produce correction pulse (CP) signals and correction sign (CS) signals.

Figure 6:
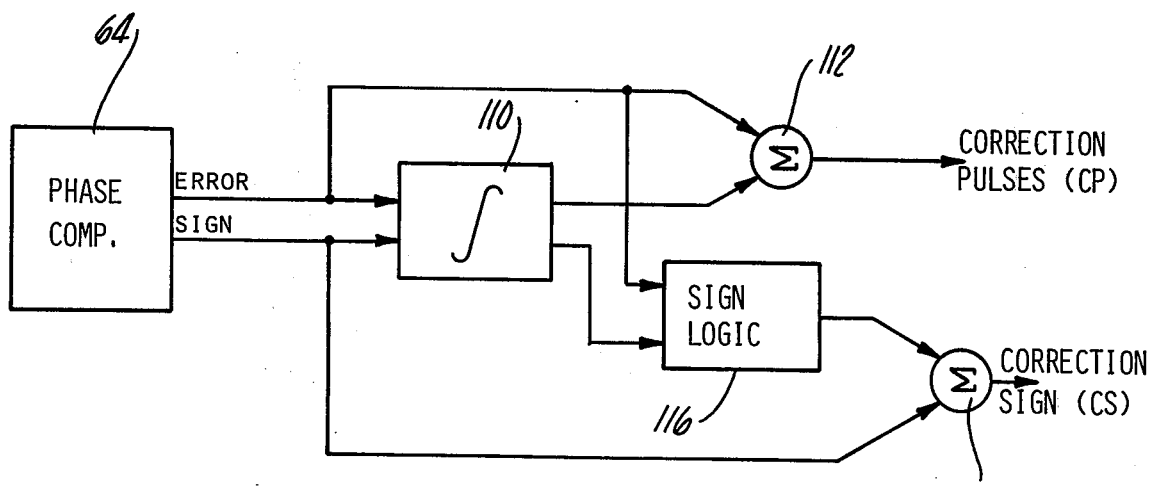
FIG. 6 is a block diagram of the correction circuit.

FIG. 6 is a block diagram showing parallel circuits of the correction circuit 68. The error signal from the Phase Comparator 64, indicative of the static error, is applied to an error integrator 110 and a sum amplifier 112. The error integrator, integrates the static error signal and generates pulse signals indicative of a dynamic correction required to keep the phase signal generated by the Phase Modulator in phase when the resolver's rotor is moving. These two corrections are summed to generate a composite correction pulse signal. In a like manner the sign signal generated by the Phase Comparator is applied to the integrator 110 and a sum amplifier 114. The integrator 110 also generates a sign signal indicative of the integrated value of the error signal which is applied to a sign logic circuit 116. The sign logic circuit also receives the error signal and operates to control the priority of the two sign signals applied to the sum amplifier 114.

Figure 7:
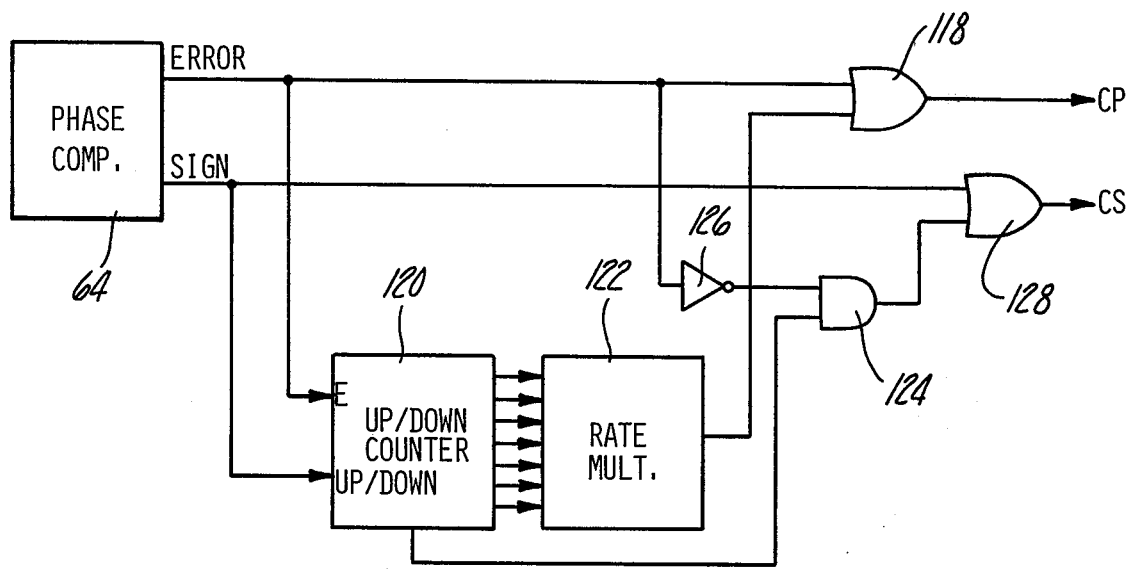
FIG. 7 is a circuit diagram of the correction circuit.

The details of the Correction Circuit are shown on FIG. 7. The error signal from the Phase Comparator 64 is applied directly to one input of OR gate 118 which is the circuit equivalent of sum amplifier 112. The error signal is also applied to the enable input of an up/down counter 120. The sign signal is applied to one input of OR gate 128 which is the circuit equivalent of sum amplifier 114 and to the up/down input of the up/down counter 120. The count content of the up/down counter 120 is input to a rate multiplier 122 and a sign signal indicative of the state of the up/down counter is applied to one input of AND gate 124. AND gate 124 also receives the complement of the error signal through inverter amplifier 126. The output of AND gate 124 is applied to the one input of OR gate 128 which also receives at its alternate input the sign signal generated by the phase comparator 64.

The output of the rate multiplier is applied to the alternate input of OR gate 118.

The operation of the Correction Circuit is described with reference to circuit shown on FIG. 7 and the waveforms shown on FIGS. 8 through 10. The error signal generated by the Phase Comparator 64 enables the up/down counter 120 which counts clock pulses either up or down as determined by the state of the sign signal. The number of clock pulses counted is determined by the duration (pulse width) of the error signal. The error signal is also output directly by OR gate 118 as a pulse signal. The rate multiplier 122 responds to the number of counts in the up/down counter at any given time and generates pulses at a rate proportional to the number of counts present. These pulses are also output through OR gate 118. The error signal directly output by OR gate 118 is indicative of the number of counts that need be incremented or decremented from the phase modulator's counter to restore the phase signal generated by the Phase Modulator with the phase of the signal output from the Limiter 62 under static conditions. If the resolver's rotor is moving, and the above correction was the only correction applied, a similar phase error would be detected by the Phase Comparator 64 at each subsequent phase comparison. The pulse signals generated by the rate modulator 122 increment or decrement the counts in the phase modulator's counter at a rate which is indicative of the average velocity at which the rotor moved to cause the detected phase error so that if the rotor continues to move the phase difference at the next comparison will be smaller. If the rotor is moving at a constant velocity, the pulses generated by the rate multiplier 122 are the correct number of counts to be added to the phase modulator's counter to keep the two square wave signals in phase.

The sign signal from the Phase Comparator 64 is treated in much the same manner. When an error signal is being generated, the error signal via inverter amplifier 126 disables AND gate 124 and the sign signal generated by the phase comparator is transmitted directly to the Phase Modulator through OR gate 128. A signal indicative of the state of the up/down counter 120, i.e. whether the stored counts are up or down, is applied to AND gate 124. AND gate 124 is enabled when the error signal is absent, and the sign signal generated by the up/down counter 120 is transmitted to the Phase Modulator through AND gate 124 and OR gate 128. It would be obvious that during transitional periods of rotor velocity, the sign signal generated by the Phase Comparator 64 may be different from the sign signal generated by the up/down counter 120.

Figure 8:
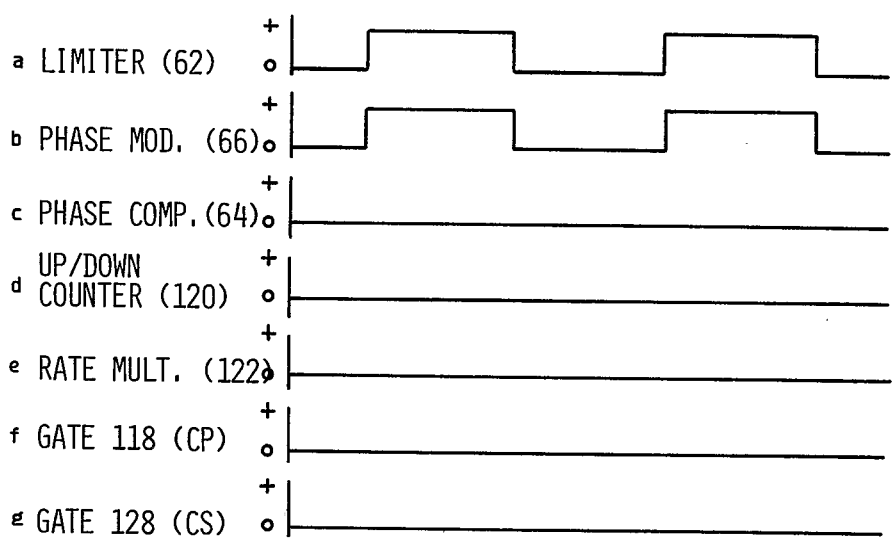
FIG. 8 illustrates the waveforms at various points in the correction circuit under static conditions.

FIG. 8 shows the waveforms of the phase signals generated by the Limiter 62 and Phase Comparator 66 under static conditions and the two signals are in phase. Under these conditions the output of the Phase Comparator 64 rate multiplier, AND gate 118 and AND gate 128 are all zero.

Figure 9:
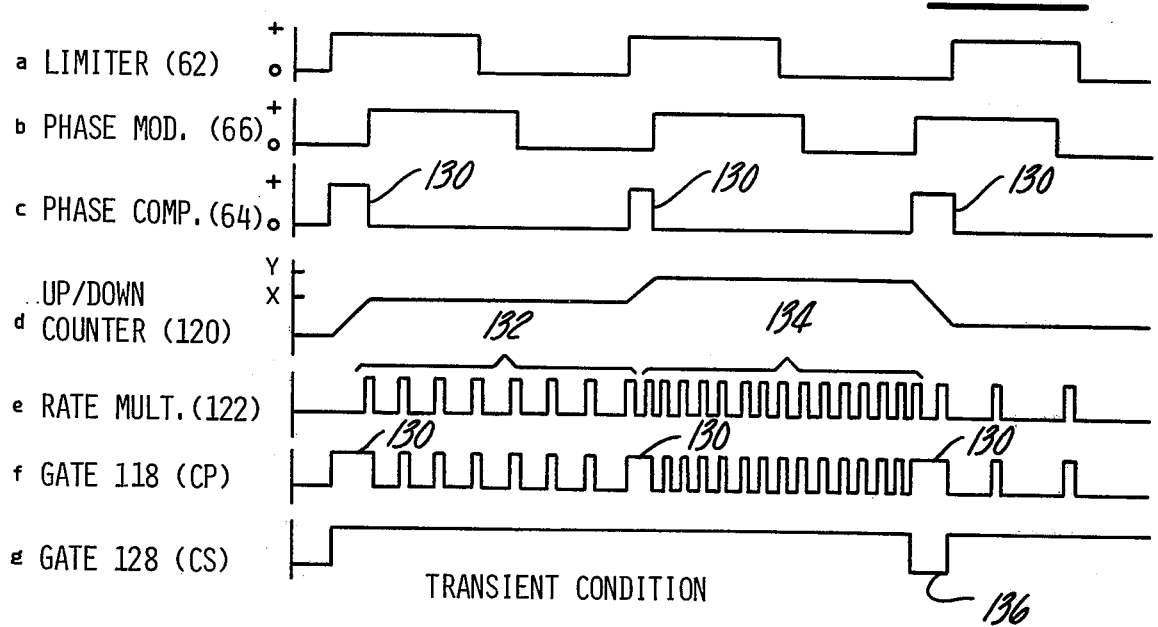
FIG. 9 illustrates the waveforms at various points in the correction circuit under transient conditions.

FIG. 9 shows the same waveforms under a transitional condition when the velocity of the rotor is changing, such as the transition period from a static condition to a dynamic condition or when the velocity of the rotor is changing. Due to this transition the two square wave signals are out of phase and an error signal 130 is generated by the Phase Comparator 64 as previously illustrated in FIG. 5A. The output of flip flop 106 is positive and the up/down counter counts up during the interval of the error signal. At the end of the error signal "X" number of counts are stored in the up/down counter. Obviously, had the phase signal from the Phase Modulator 66 preceded the phase signal from the Limiter 62, the output of flip flop 106 would have been a logic 0 and the up/down counter would have counted down during the error signal interval. During the generation of the error signal 130 OR gate 118 outputs the error signal and OR gate 128 outputs the sign signal generated by the Phase Comparator 64. The rate multiplier 122 responds to the number of counts stored in the up/down counter 120 and starts to generate pulses 132 at a rate proportional to number of stored counts "X", as shown on waveform 9(e). When the error signal is terminated the output of the rate multiplier continues to be transmitted through OR gate 118 producing the composite waveform shown on waveform (f). The end of the error signal also enables AND gate 124 and a positive sign signal generated by the up/down counter 120, indicative that the final state of the up/down counter is the count up state is output through OR gate 128, as shown on waveform 9(g).

If upon the occurrence of the next comparison the phase signal from the Limiter 62 still precedes the signal from the Phase Modulator, as shown, a comparable error signal is generated and the counter is counted up still further. At the end of this error signal the counts stored in the up/down counter increased from "X" to "Y". OR gates 118 and 128 again output the error and sign signal generated by the Phase Comparator during the occurence of the error signal. The pulses 134 generated by the rate multiplier 122 now occur at a faster rate and the waveform output from OR gate 118 reflects this change as shown on waveform 9(f). Since the state of the up/down counter remains in the count up state the sign signal output from OR gate 118 remains a positive signal.

When the signal from Phase Modulator preceded the signal from the Limiter 62, as shown in the third section of waveform 9(a) and 9(b), the up/down counter 120 will be counted down during the occurrence of the error signal OR gates 118 and 128 would still pass the error signal 130 and the sign signal generated by the Phase Comparator; however, the sign signal, in this case, will be negative, as shown by the pulse 136 shown on waveform 9(g). If the state of the up/down counter remains in the count "up" state, the sign output of the counter would remain positive as shown. However, if the error signal was sufficiently large so that the final state of the up/down counter is in the count "down" state, the sign signal generated by the up/down counter would have changed and become a low or logic 0. The rate multiplier 122 generates pulses at a rate proportional to the number of counts remaining in the up/down counter, independent of whether they are positive or negative.

Figure 10:
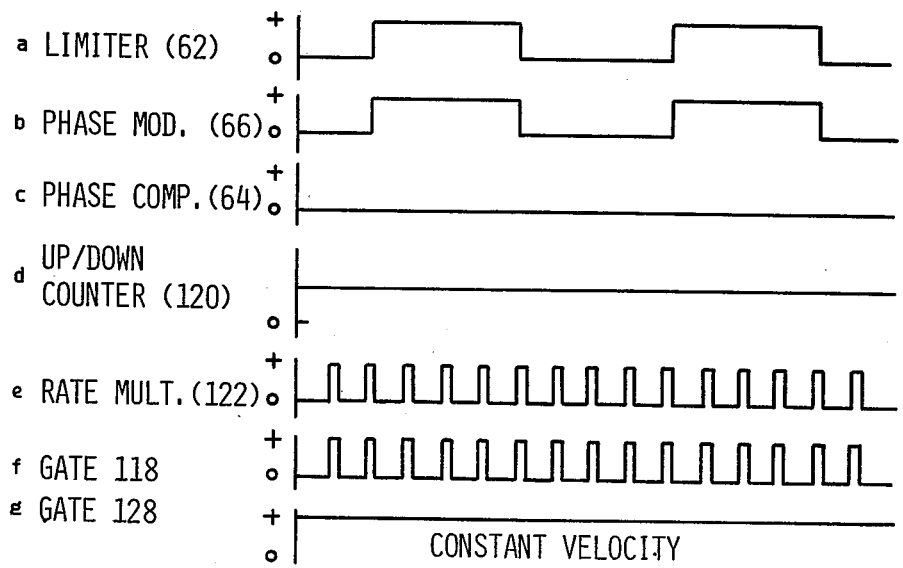
FIG. 10 illustrates the waveforms at various points in the correction circuit at a constant velocity.

FIG. 10 shows the waveforms with the rotor moving at a constant velocity and the two square wave signals in phase. The error output of the Phase Comparator is zero, therefore, the number of counts "Z" stored in up/down counter 120 does not change and the rate multiplier continues to generate pulses at a fixed rate indicative of the number of pulses required to be added to the phase modulators counter to keep the phase signal generated by the Phase Modulator in phase with the signal from the Limiter. The sign signal output by OR gate 128 is the signal generated by the up/down counter and may be positive as indicated or negative, depending upon whether the up/down counter is in its count "up" or "down" state. The output of the Correction Circuit will remain unchanged as long as the velocity of the rotor remains unchanged and no error signal is generated.

PHASE MODULATOR

Figure 11:
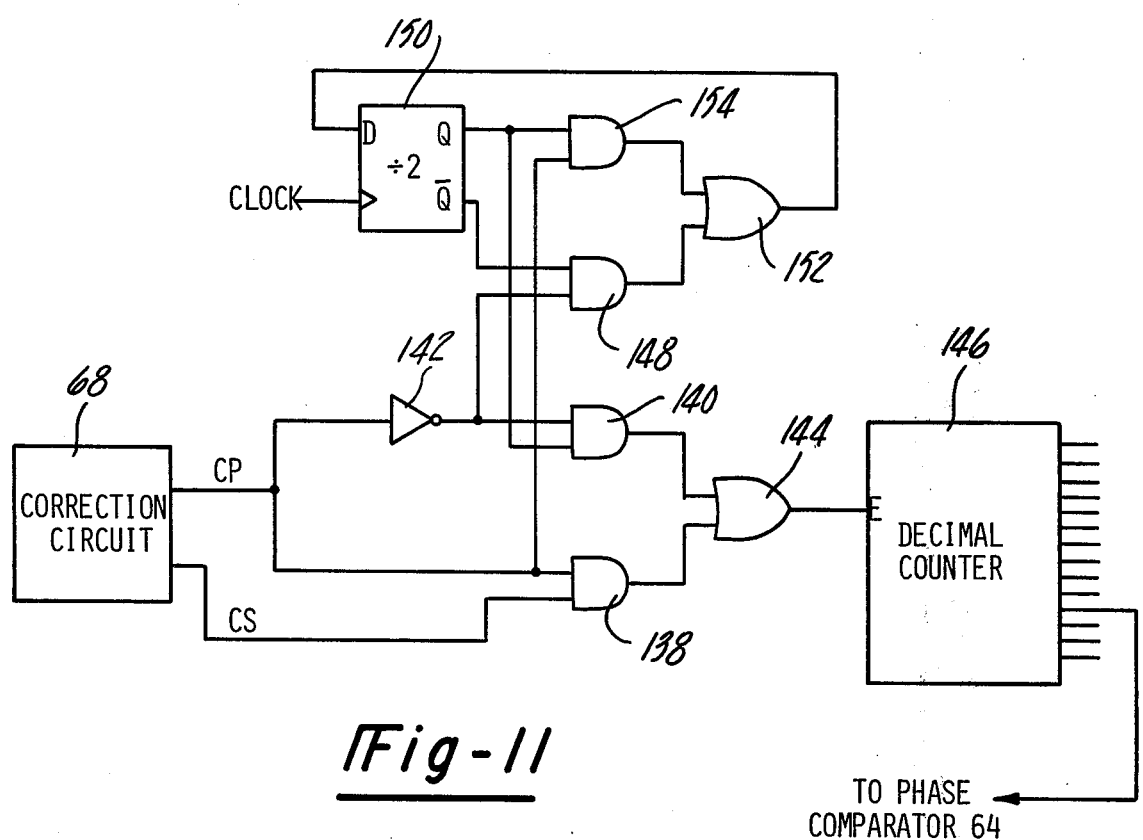
FIG. 11 is a circuit diagram of the phase modulator.

The Phase Modulator 66 advances or retards the phase signal generated by its counter in response to the correction pulse (CP) and correction sign (CS) signals generated by the correction circuit 68. The details of the Phase Modulator are shown on FIG. 11. The CP signal generated by the correction circuit is applied to one input of AND gates 138 and 154 and its complement to one input of AND gate 140 by means of inverter amplifier 142. The CS signal is applied to the alternate input of AND gate 138. The outputs of AND gates 138 and 140 are input to OR gate 144 having its output connected to the enable gate of decade counter 146. The output of the counter 146, indicative of a pedetermined number of counts, is the phase modulated signal generated by the phase modulator. In the preferred embodiment this output is indicative of 2000 counts. The output of inverter amplifier 142 is also connected to one input of AND gate 148 receiving the signal at the $\bar{Q}$ output of a D type flip flop 150 at its alternate input. The output of AND gate 148 is connected to one input of OR gate 152 which has its output connected to the D input of flip flop 150. The Q output of flip flop 150 is connected to one input of AND gate 154 and the alternate input of AND gate 140. Flip flop 150 is enabled by clock pulses. In this configuration flip flop 150 functions as a divide by two ($\div 2$) stage.

The operation of this circuit is as follows. In the static state the CP and CS signals are normally low so AND gates 138 and 154 are disabled and AND gates 140 and 148 are enabled by the complement output of inverter amplifier 142. The $\bar{Q}$ output of flip flop 150 is connected back to the D input causing flip flop 150 to toggle on each clock pulse. The Q output of flip flop 150 will therefore enabled counter 146 through AND gate 140 and OR gate 144 every other clock pulse. In the static condition counter 146 is indexed at the same rate as counter 52 in the reference generator 38 and the two square wave signals will stay in phase independent of the rotor's position.

When the phase signal from the Limiter 62 precedes the phase signal from the Phase Modulator 64, the CP and CS signals both go high during the occurrence of the error signal. This causes the output of AND gate 138 to go high enabling counter 146 through OR gate 144 to count every clock pulse thereby incrementing the number of counts in the counter by a number directly proportional to the duration of the error signal. When the phase signal from the Phase Modulator 64 precedes the signal from the Limiter 62 the CP signal is high and CS signal is low disabling both AND gates 138 and 140 and, therefore, disabling counter 146 during the occurrence of the error signal. The counter 146 is thereby decremented a number of counts proportional to the duration of the error signal.

After the error signal is terminated the CP normally goes low except during the intervals when a pulse is generated by the rate multiplier. If the CS signal is high indicating the counts in the up/down counter is positive (i.e. the rotor is moving in a positive direction), each positive pulse from the rate multiplier 122 enables counter 146 to increment an extra count through AND gate 138 and OR gate 144. If the CS signal is negative, each positive pulse from the rate multiplier 122 disables AND gate 138 and one pulse generated by the toggling of flip flop 150 is decremented from the counter 146. In this way the phase signal generated by the decimal counter is kept in phase with the signal from the Limiter 62. The number of counts stored in counter 146 is a number indicative of the difference between the phase of the rotating magnetic field and the phase of the resolver's rotor.

This number of stored clock pulses in the Phase Modulator 66 are transmitted to the Computer 14 via gate 70, bus I/O Interface 72 and Bus 22 upon a command signal generated by the Computer as discussed relative to FIG. 3.

Although the invention has been illustrated and disclosed with reference to particular circuit configurations, it is understood that comparable circuits using different elements, yet having the same functions could be designed by a person skilled in the art without departing from the spirit of the invention. For instance, one could use inductrosyns in place of the resolvers disclosed herein or the circuits may take alternate forms and still perform the same functions.

I claim:

1. An absolute resolver digitizer for use in combination with a resolver having stator means and a rotor means comprising:
reference generator means for generating resolver excitation signals exciting the resolver's stator means to generate a rotating field and for generating digital field position data indicative of the instantaneous angular position of said ratating field; and
resolver follower means for generating digital sum position data indicative of the sum of the instantaneous position of the resolver's rotor means in response to signals induced in the rotor means by said rotating field;
wherein said reference generator means comprises
reference generator counter means for storing counts at a predetermined frequency and for generating an overflow signal when the stored counts reach a predetermined number wherein the number of counts stored in said reference generator counter means is said field position data; and
resolver exciter means for generating said resolver excitation signals in response to said overflow signals; and
wherein said resolver follower means comprises
phrase modulator means for generating phase modulated signals and said digital sum data in response to correction signals;
phase comparator means for comparing the phase of the signals induced in said rotor means with said phase modulated signals to generate error signals indicative of the phase error between the two signals compared; and
correction circuit means for generating said correction signals in response to said error signals.

2. The absolute resolver digitizer of claim 1 further including circuit means for generating digital data indicative of the resolver's rotor means instantaneous angular position in response to said field position data and said sum position data.

3. The absolute resolver digitizer of claim wherein the error signals generated by said phase comparator means comprises a phase error signal indicative of the magnitude of the phase error between the signal induced in said rotor means and said phase modulted signal and a sign signal indicative of which compared signal was first received, said correction circuits means comprises:
integrator means for integrating said phase error signals and said sign signals to generate pulse signals at a rate indicative of the average angular velocity of said rotor means and an integrated sign signal indicative of the direction in which said rotor means is moving;
sign logic means receiving said phase error signal and said integrated sign signal for terminating the transmission of the integrated sign signal when the phase comparator is generating said error signal;
a first summation circuit combining said phase error signal with the pulse signals generated by said integrator means to generate a correction pulse signal; and
a second summation circuit combining said sign signal with the integrated sign signal transmitted by said sign logic means to generate a correction sign signal.

4. The absolute resolver digitizer of claim 3 wherein said phase error signal is a phase error pulse signal having a pulse duration indicative of the magnitude of the phase error between the signal induced in said rotor means and said phase modulated signal, said integrator comprises:
up/down counter means, enabled by said phase error pulse signal and counting in a direction determined by said sign signal for storing an integrated number of counts indicative of the integrated duration of successive phase error signals and for generating said integrated sign signal indicative of whether the integrated number of counts are greater or less than zero; and
a rate multiplier for generating said pulse signals at a rate proportional to the number of integrated counts stored in said up/down counter means.

5. The absolute resolver digitizer of claim 3 wherein said phase modulator means comprises:
a counter enable circuit for generating counter enable signals in response to said correction pulse signals and said correction sign signal, said counter enable circuit generating pulse counter enable signals at said predetermined frequency in response to the absence of said correction pulse signals, generating a continuous counter enable signal in response to the simultaneous occurrence of a correction pulse signal and a correction sign signal and generating no counter enable signal in response to the occurrence of a correction pulse signal and the absence of a correction sign signal; and
a phase modulator counter for storing a number of counts in response to said counter enable signals, said phase modulator counter storing counts at said predetermined frequency in response to counter enable signals in the form of pulses at said predetermined frequency, storing counts at twice said predetermined frequency in response to a continuous counter enable signal, and storing no counts in the absence of a counter enable signal;
wherein the instantaneous number of counts stored in said phase modulator counter is said digital sum position data and the overflow signal indicative of said predetermined number of stored counts is said phase modulated signal transmitted to said comparator means.

6. The absolute resolver digitizer of claim 5 wherein said counter enable circuit comprises:
   a pulse generating circuit generating said pulse counter enable signals at said predetermined frequency; and
   a gate circuit receiving said correction pulse signals, said correction sign signals and pulse counter enable signals, said gate circuit transmitting said pulse counter enable signals in response to an absence of a correction pulse signal, transmitting said correction pulse signals in response to the simultaneous occurrence of a correction sign signal, and blocking the transmission of all signals in response to the occurrence of a correction pulse signal and the absence of a correction sign signal.

7. The absolute resolver digitizer of claim 5 further including circuit means for generating digital data indicative of the resolver's rotor means instantaneous position in response to the number of counts stored in said reference generator counter means and said phase modulator counter.

8. An apparatus for generating a digital signal indicative of an angular displacement comprising:
   a resolver having stator means for generating a field and rotor means responsive to an angular displacement for generating an induced signal indicative of the angular displacement between said field and said rotor means;
   reference generator means for generating resolver excitation signals exciting said stator means to generate a rotating field and for generating digital field position data indicative of the instantaneous angular position of said rotating field; and
   resolver follower means for generating digital sum position data indicative of the sum of the instantaneous angular position of said rotating field and the instantaneous position of said rotor means in response to signals induced in said rotor means by said rotating field;
   wherein said reference generator means comprises
   reference generator counter means for storing counts at a predetermined frequency and for generating an overflow signal when the stored counts reach a predetermined number wherein the number of counts stored in said reference generator counter means is said field position data; and
   resolver exciter means for generating said resolver excitation signals in response to said overflow signals; and
   wherein said resolver follower means comprises
   phase modulator means for generating phase modulated signals and said digital sum data in response to correction signals;
   phase comparator means for comparing the phase of the signals induced in said rotor means with said phase modulated signals to generate error signals indicative of the phase error between the two signals compared; and
   correction circuit means for generating said correction signals in response to said error signals.

9. The apparatus digitizer of claim 8 further including circuit means for generating digital data indicative of said rotor means instantaneous angular position in response to said field position data and said sum position data.

10. The apparatus digitizer of claim 8 wherein the error signals generated by said phase comparator means comprises a phase error signal indicative of the magnitude of the phase error between the signal induced in said rotor means and said phase modulated signal and a sign signal indicative of which compared signal was first received, said correction circuit means comprises:
   integrator means for integrating said phase error signals and said sign signals to generate pulse signals at a rate indicative of the average angular velocity of said rotor means and an integrated sign signal indicative of the direction in which said rotor means is moving;
   sign logic means receiving said phase error signal and said integrated sign signal for terminating the transmission of the integrated sign signal when the phase comparator is generating said error signal;
   a first summation circuit combining said phase error signal with the pulse signals generated by said integrator means to generate a correction pulse signal; and
   a second summation circuit combining said sign signal with the integrated sign signal transmitted by said sign logic means to generate a correction sign signal.

11. The apparatus digitizer of claim 10 wherein said phase error signal is a phase error pulse signal having a pulse duration indicative of the magnitude of the phase error between the signal induced in said rotor means and said phase modulated signal, said integrator comprises:
   up/down counter means, enabled by said phase error pulse signal and counting in a direction determined by said sign signal for storing an integrated number of counts indicative of the integrated duration of successive phase error pulse signals and for generating said integrated sign signal indicative of whether the integrated number of counts are greater or less than zero; and
   a rate multiplier for generating said pulse signals at a rate proportional to the number of integrated counts stored in said up/down counter means.

12. The apparatus digitizer of claim 10 wherein said phase modulator means comprises:
   a counter enable circuit for generating counter enable signals in response to said correction pulse signals and said correction sign signal, said counter enable circuit generating pulse counter enable signals at said pedetermined frequency in response to the absence of said correction pulse signals, generating a continuous counter enable signal in response to the simultaneous occurrence of a correction pulse signal and a correction sign signal and generating no counter enable signal in response to the occurrence of a correction pulse signal and the absence of a correction sign signal; and
   a phase modulator counter for storing a number of counts in response to said counter enable signals, said phase modulator counter storing counts at said predetermined frequency in response to counter enable signals in the form of pulses at said predetermined frequency, storing counts at twice said predetermined frequency in response to a continuous counter enable signal, and storing no counts in the absence of a counter enable signal;

wherein the instantaneous number of counts stored in said phase modulator counter is said digital sum position data and the overflow signal indicative of said predetermined number of stored counts is said phase modulated signal transmitted to said comparator means.

13. The apparatus digitizer of claim 12 wherein said counter enable circuit comprises:
- a pulse generating circuit generating said pulse counter enable signals at said predetermined frequency; and
- a gate circuit receiving said correction pulse signals, said correction sign signals and pulse counter enable signals, said gate circuit transmitting said pulse counter enable signals in response to an absence of a correction pulse signal, transmitting said correction pulse signals in response to the simultaneous occurrence of a correction sign signal, and blocking the transmission of all signals in response to the occurrence of a correction pulse signal and the absence of a correction sign signal.

14. The apparatus digitizer of claim 12 further including circuit means for generating digital data indicative of the resolver's rotor means instantaneous position in response to the number of counts stored in said reference generator counter means and said phase modulator counter.

15. In combination with a numerical control system for controlling the displacement of a moveable member along at least one axis, said numerical control system comprising:
- a moveable member operable to move in response to command signals;
- a resolver having stator means for generating a field and rotor means angularly displaced with the movement of said moveable member, for generating a phase signal indicative of the position of said moveable member, said phase signal being indicative of the phase angle between a field generated by said stator means and the angular position of said rotor means;
- means for reading data from a permanent recording to generate input data indicative of the desired movement of said moveable member; and
- computer means having storage and computation capabilities for generating commanded position data indicative of the desired position of said moveable member in response to said input date and for generating said command signal in response to the difference between said commanded position data and actual position data indicative of the instantaneous actual position of the moveable member an improvement for generating the actual position data comprising
- reference generator means for generating signals exciting the resolver's stator means to generate a rotating field and for generating digital field position data indicative of the instantaneous angular orientation of said rotating field; and
- resolver follower means for generating digital sum position data indicative of the instantaneous angular position of said rotating field and the instantaneous position of the resolver's rotor means in response to signals induced in the rotor means by said rotating field wherein the difference between said sum position data and said field position data is actual position data indicative of the instantaneous position of said rotor means;

wherein said reference generator means comprises
- reference generator counter means for storing counts at a predetermined frequency and for generating an overflow signal when the stored counts reach a predetermined number wherein the number of counts stored in said reference generator counter means is said field position data; and
- resolver exciter means for generating said resolver excitation signals in response to said overflow signals; and wherein said resolver follower means comprises
- phase modulator means for generating phase modulated signals and said digital sum data in response to correction signals;
- phase comparator means for comparing the phase of the signals induced in said rotor means with said phase modulated signals to generate error signals indicative of the phase error between the two signals compared; and
- correction circuit means for generating said correction signals in response to said error signals.

16. The combination of claim 15 wherein said absolute resolver digitizer further includes circuit means for combining said field position data with said sum position data to generate said actual position data.

17. The combination of claim 15 wherein said computer means includes means for combining said sum position data and said field position data to generate said actual position data, said sum position data and field position data are input directly to said computer means.

18. The combination of claim 15 wherein the error signals generated by said phase comparator means comprises a phase error signal indicative of the magnitude of the phase error between the signal induced in said rotor means and said phase modulated signal and a sign signal indicative of which compared signal was first received, said correction circuit means comprises:
- integrator means for integrating said phase error signals and said sign signals to generate pulse signals at a rate indicative of the average angular velocity of said rotor means and an integrated sign signal indicative of the direction in which said rotor means is moving;
- sign logic means receiving said phase error signal and said integrated sign signal for terminating the transmission of the integrated sign signal when the phase comparator is generating said error signal;
- a first summation circuit combining said phase error signal with the pulse signals generated by said integrator means to generate a correction pulse signal; and
- a second summation circuit combining said sign signal with the integrated sign signal transmitted by said sign logic means to generate a correction sign signal.

19. The combination of claim 18 wherein said phase error signal is a phase error pulse signal having a pulse duration indicative of the magnitude of the phase error between the signal induced in said rotor means and said phase modulated signal, said integrator comprises:
- up/down counter means, enabled by said phase error pulse signal and counting in a direction determined by said sign signal for storing an integrated number of counts indicative of the integrated duration of successive phase error pulse signals and for generating said integrated sign signal indicative of whether the integrated number of counts are greater or less than zero; and a rate multiplier for generating said pulse signals at a rate proportional to the number of integrated counts stored in said up/down counter means.

20. The combination of claim 18 wherein said phase modulator means comprises:
 a counter enable circuit for generating counter enable signals in response to said correction pulse signals and said correction sign signal, said counter enable circuit generating pulse counter enable signals at said predetermined frequency in response to the absence of said correction pulse signals, generating a continuous counter enable signal in response to the simultaneous occurrence of a correction pulse signal and a correction sign signal and generating no counter enable signal in response to the occurrence of a correction pulse signal and the absence of a correction sign signal; and
 a phase modulator counter for storing a number of counts in response to said counter enable signals, said phase modulator counter storing counts at said predetermined frequency in response to counter enable signals in the form of pulses at said predetermined frequency, storing counts at twice said predetermined frequency in response to a continuous counter enable signal, and storing no counts in the absence of a counter enable signal;
 wherein the instantaneous number of counts stored in said phase modulator counter is said digital sum position data and the overflow signal indicative of said predetermined number of stored counts is said phase modulated signal transmitted to said comparator means.

21. The combination of claim 20 wherein said counter enable circuit comprises:
 a pulse generating circuit generating said pulse counter enable signals at said predetermined frequency; and
 a gate circuit receiving said correction pulse signals, said correction sign signals and pulse counter enable signals, said gate circuit transmitting said pulse counter enable signals in response to an absence of a correction pulse signal, transmitting said correction pulse signals in response to the simultaneous occurrence of a correction sign signal, and blocking the transmission of all signals in response to the occurrence of a correction pulse signal and the absence of a correction sign signal.

22. The absolute resolver digitizer of claim 20 further including circuit means for generating digital data indicative of the resolver's rotor means instantaneous position in response to the number of counts stored in said reference generator counter means and said phase modulator counter.

* * * * *